(12) United States Patent
Raza et al.

(10) Patent No.: US 6,657,472 B1
(45) Date of Patent: *Dec. 2, 2003

(54) CIRCUIT, SYSTEM, AND METHOD FOR PROGRAMMABLY SETTING AN INPUT TO A PRIORITIZER OF A LATCH TO AVOID A NON-DESIRED OUTPUT STATE OF THE LATCH

(75) Inventors: S. Babar Raza, San Jose, CA (US); Steven C. Meyers, Round Rock, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/132,857

(22) Filed: Apr. 25, 2002

(51) Int. Cl.⁷ ............................................... H03K 3/037
(52) U.S. Cl. ........................................ 327/217; 327/225
(58) Field of Search ................................. 327/217, 215, 327/214, 225, 219

(56) References Cited

U.S. PATENT DOCUMENTS

| | | | | |
|---|---|---|---|---|
| 4,112,318 A | * | 9/1978 | Hamelink | 327/217 |
| 4,540,903 A | | 9/1985 | Cooke et al. | 327/211 |
| 5,051,610 A | * | 9/1991 | Terane et al. | 327/210 |
| 5,208,487 A | | 5/1993 | Matsuura et al. | 327/208 |
| 5,331,207 A | * | 7/1994 | Tanoi | 327/198 |
| 5,625,309 A | * | 4/1997 | Fucili et al. | 327/217 |
| 6,232,810 B1 | * | 5/2001 | Oklobdzija et al. | 327/217 |
| 6,291,981 B1 | * | 9/2001 | Sartschev | 324/76.82 |
| 6,362,674 B1 | * | 3/2002 | Kermani | 327/217 |
| 6,373,310 B1 | | 4/2002 | Jacobs | 327/217 |
| 6,429,712 B1 | | 8/2002 | Gaiser et al. | 327/217 |

* cited by examiner

*Primary Examiner*—Timothy P. Callahan
*Assistant Examiner*—Cassandra Cox
(74) *Attorney, Agent, or Firm*—Kevin J. Daffer; Conley Rose P.C.

(57) ABSTRACT

The present invention includes a circuit, system, and method for avoiding a non-desired output from a latch, and a selector circuit that is programmable to select an input to a prioritizer which, based on that input, sets the latch output to avoid a non-desired state regardless of the latching input values. The embodiments described herein are useful in forming a non-clocked latch that employs set and reset inputs, and thus, may be an SR latch. The SR latch is envisioned having either MOSFET or bipolar transistors, and can be employed either having only NMOS transistors, only PMOS transistors, or CMOS transistors. The latch also includes an improved selector circuit that is easily programmed to configure the latch in either a set-dominant, a reset-dominant, or a memory-dominant configuration based solely on the voltage values fed to the latch by the selector circuit. As such, the selector circuit of the present invention embodies an improved programmability over previous circuits.

18 Claims, 5 Drawing Sheets

| SET_CONFIG_BIT | RESET_CONFIG_BIT | OUT1 | OUT2 | CONFIGURATION | Q | $\overline{Q}$ |
|---|---|---|---|---|---|---|
| 0 | 0 | $\overline{S}$ | $\overline{R}$ | MEMORY | Q | $\overline{Q}$ |
| 0 | 1 | $\overline{V}_{DD}$ | $\overline{R}$ | RESET | 0 | 1 |
| 1 | 0 | $\overline{S}$ | $\overline{V}_{DD}$ | SET | 1 | 0 |
| 1 | 1 | $\overline{S}$ | $\overline{R}$ | MEMORY | Q | $\overline{Q}$ |

CIRCUIT, SYSTEM, AND METHOD FOR PROGRAMMABLY SETTING AN INPUT TO A PRIORITIZER OF A LATCH TO AVOID A NON-DESIRED OUTPUT STATE OF THE LATCH

CROSS REFERENCE TO RELATED APPLICATIONS

This application is related to a commonly assigned, prior application Ser. No. 09/951,369, filed Sep. 13, 2001.

BACKGROUND OF THE INVENTION

1. Field of the Invention

This invention relates to a circuit, system and method for avoiding a non-desired output from a latch and, in particular, to a selector circuit that is programmable to select an input to a prioritizer which, based on that input, sets the latch output to avoid a non-desired state regardless of the latching input values.

2. Description of the Related Art

The following descriptions and examples are not admitted to be prior art by virtue of their inclusion within this section.

A latch is typically understood to be any device that can store information. A popular form of a latch is alternatively known as a "flip-flop." A latch or flip-flop is designed to produce an output that is stable in one of two logic states. The output logic level will remain until the input to the latch undergoes a change in logic level.

Output from the latch can be at a "true," "on," "high," or "1" logic level or, alternatively, at a "false," "off," "low," or "0" logic level. For convenience in relating relativity to logic level, the former logic level, logical 1, is assumed to be the most positive voltage and the latter logic level, logical 0, represents the most negative voltage value. This relationship is known as positive logic and is used as a convention herein.

There are several types of latches used to store logical 1 or logical 0 logic levels. Latches can be classified as either clocked or non-clocked. If clocked, a clock pulse controls the times at which outputs from the latch can transition. For example, a toggle latch will impart toggling action on the output of the latch during transitions of the clock pulse whenever the toggling input is at a logical 1 logic level. Other forms of latches may not require any clock input whatsoever. For example, a set/reset (SR) latch causes an output from the latch to be set or reset depending on the logic levels of signals placed on the set and reset inputs.

Regardless of whether a latch is clocked or not, there are generally two complimentary outputs produced from a latch. The complimentary outputs are oftentimes referred to as differential outputs, in that while one output is at a logical 1 level, the other output is at a logical 0 level (i.e., complimentary to the former logic level). The complimentary outputs are oftentimes labeled Q and Q'. When one output is at the logical 1 state, the other output is always at a logical 0 state. In this manner, if the latch changes state, then both Q and Q' change. A latch is considered to be "set" when Q is in a logical 1 state and Q' is in a logical 0 state. Conversely, the latch is "reset" when Q is in a logical 0 state, and Q' is in a logical 1 state. Generally, a latch is reset in anticipation of it being subsequently set to store binary information.

A simple example of a non-clocked set/reset (SR) latch is shown in FIG. 1. In particular, FIG. 1 illustrates a NAND gate SR latch 10a and a NOR gate SR latch 10b. Latch 10a comprises a pair of cross-connected NAND gates 12 and 14, while latch 10b comprises a pair of cross-connected NOR gates 16 and 18. Latches 10 each have two inputs labeled S and R (for set and reset) and, therefore, are classified as SR latches. Each latch 10 also has a pair of complimentary outputs labeled Q and "Q bar" (or Q').

Referring to the truth tables 20a and 20b, logic levels are shown for outputs Q and Q' corresponding to inputs S and R. Truth table 20a represents the operation of the NAND gate SR latch 10a, while truth table 20b represents the operation of the NOR gate SR latch 10b. Referring to truth table 20a, it can be seen that if the S input goes to a logic 0 level, then the latch will go to its set state (Q equals a logic 1 level), and will remain in that state until reset. When the R input goes to a logic 0 level, then the latch will go to its reset state and stay there until it is set again. Thus, an SR latch changes state upon sensing a change in state at the S or R inputs, and stores the results of the change until the opposite input is activated. Truth table 20b indicates that the NOR gate SR latch will transition to a set state whenever the S input goes to a logic 1 level, and will transition to a reset state when the R input goes to a logic 1 level.

The set and reset states are noted as "SET" and "RST," as shown in FIG. 1. In addition to the set and reset states, two special conditions of interest exist for an SR latch. First, whenever both of the S and R inputs are at a logic 1 level (for the NAND gate embodiment 10a) or at a logic 0 level (for the NOR gate embodiment 10b) no change is made to the complimentary outputs. This state is noted as a memory ("MEM") state since the outputs retain their previous logic levels. However, if both of the set and reset inputs are at a logic 0 level (for the NAND gate embodiment 10a) or at a logic 1 level (for the NOR gate embodiment 10b), then the complimentary output conductors enter the same state: either logic 1 level for the NAND gate latch 10a or a logic 0 level for the NOR gate latch 10b. Having the same logic level on the complimentary output is not desired and, accordingly, this state is labeled "ND."

A non-desired output state is to be prevented for at least two reasons. First, the complimentary outputs are generally used elsewhere in the circuit subsystem. That subsystem depends on the Q output being 180° out of phase with the Q' output. Having the Q and Q' outputs at the same logic levels could be catastrophic to the operation of any load coupled to receive complimentary inputs. Second, the non-desired state can produce non-deterministic logic levels. For example, if a transistor within logic gate 14 is made having stronger drive outputs than a transistor within NAND gate 12, then even though the set and reset inputs are at a logic 0 level, the Q output may skew to a differential logic level from that of the Q' output. This may indicate a set state when, in fact, the set and reset inputs are not in a set condition (e.g., the set input being at a logic 0 level and the reset input being at a logic 1 level for the exemplary NAND gate example).

Therefore, most designers attempt to avoid placing a latch in a non-desired state. However, there may be times when the non-desired state is difficult to avoid and is uncontrollably dependent on the set and reset input conditions. Thus, it would be desirable to introduce an improved SR latch that can avoid a non-desired state regardless of the SR input values. In addition to avoiding a non-desired state, it would be further desirable to provide an improved selector circuit that is easily programmed to force the latch to output complimentary signals regardless of input signals sent to the latch.

SUMMARY OF THE INVENTION

The problems outlined above are in large part solved by an improved latch including an improved, programmable selector circuit. Preferably, the latch is an SR latch that need not be clocked, and can avoid non-desired states. The latch can be implemented as a quasi-NAND gate or quasi-NOR gate configuration. In addition to the set and reset inputs, the latch receives programmable inputs via the programmable selector circuit. Depending on the logic value of the programmable inputs, the latch can be easily programmed to give priority to the set input, the reset input, or both.

The programmed inputs are fed onto gate conductors or base conductors of respective transistors coupled in series with the transistors that receive the set and reset inputs. The series-connected resistors are also cross-coupled with and parallel to corresponding transistors within a memory or latch cell. The pairs of series-connected transistors can, therefore, form a prioritizer or priority encoder according to one embodiment. The purpose of the memory element is to simply store the complimentary outputs produced by the prioritizer and retain those outputs on the output conductors of the latch. Furthermore, the selector circuit is used to select "set bar" (S'), "reset bar" (R'), or both set' and reset' to be placed on the programmable inputs of the prioritizer.

The latch can be implemented using solely n-type (NMOS) transistors or bipolar (NPN) transistors. Alternatively, the latch can use p-type (PMOS) transistors or PNP transistors. If implemented with the latter form of transistors, then the set and reset inputs can receive complimentary set and reset values, while the programmable inputs can receive set, reset, or set and reset values. For example, use of PMOS transistors rather than NMOS transistors merely indicates that the values on the set, reset, and programmable inputs are switched to the corresponding complimentary values. This also applies to switching between either a sourcing power supply or ground. If NMOS transistors are used, then a sourcing power supply ($V_{DD}$) is used on one programmable input. Conversely, a ground ($V_{SS}$) is used in lieu of $V_{DD}$ if PMOS transistors are used.

According to one embodiment, a latch includes a selector circuit having a pair of input conductors and a prioritizer coupled to an output of the selector circuit. The selector circuit can receive a pair of programmable signals forwarded to the pair of input conductors, while the prioritizer can receive a pair of set and reset signals of substantially the same logic value (i.e. both set and reset signals have logic 1 values, or alternatively, both have logic 0 values). In addition, the selector circuit is adapted to output a pair of voltage values to the prioritizer so as to configure the prioritizer into a set-dominant state, a reset-dominant state, or a memory-dominant state. The selector circuit is thereby adapted to program the latch not only to avoid the non-desired state, but also to force the latch into one of three states dependent on the programmable signals sent to the selector circuit.

For example, the selector circuit may output a voltage value that is complementary to the set signal during times when the programmable signals are of substantially dissimilar logic value. In such an example, the voltage value produced by the selector circuit would configure the prioritizer into a set-dominant state. On the other hand, to configure the prioritizer into a reset-dominant state, the selector circuit may output a voltage value that is complementary to the reset signal during times when the programmable signals are of substantially dissimilar logic value. Alternatively, the selector circuit may output a pair of voltage values complementary to the pair of set and reset signals during times when the programmable signals are of substantially similar logic value. In this example, the pair of voltage values would configure the prioritizer into a memory-dominant state, such that the prioritizer would produce a pair of complementary logic values upon the output conductors of the latch even when the set and reset signals have similar logic values. In other words, the latch will substantially avoid the non-desired state regardless of the latch input values.

According to another embodiment, a system for latching complementary voltage values includes a prioritizer, a selector circuit, and an execution unit. The prioritizer is coupled to receive set and reset signals. In addition, the selector circuit can receive programmable bits from the execution unit, which is coupled to the selector circuit to set each of the programmable bits to either a logic 1 or logic 0 value. In this manner, the selector circuit is adapted to configure the prioritizer to produce complementary logic voltage values at the output of the prioritizer regardless of whether the set and reset signals are at the same or dissimilar logic voltage values. Thus, the logic value of the a programmable bits determines whether the set signal, the reset signal, or the previous set and reset signals are latched upon the output conductors of the prioritizer, and thus, the output conductors of the latch.

According to yet another embodiment, a method is provided for preventing a non-desired output from a latch. The method includes receiving a similar logic voltage value on set and reset conductors, while receiving programmable voltage values that are adapted to configure the latch output. Depending on the programmable voltage values, the method further includes placing upon a pair of output conductors of the latch either (i) the logic voltage value on the set conductor and its complementary logic voltage value, (ii) the logic voltage value on the reset conductor and its complementary logic voltage value, or (iii) the logic voltage values on the set and reset conductors preceding the step of receiving a similar logic voltage value on set and reset conductors. In this manner, the method includes programming the voltage values to fix the output of the latch as a set-dominant latch output, a reset-dominant latch output, or a memory-dominant latch output.

BRIEF DESCRIPTION OF THE DRAWINGS

Other objects and advantages of the invention will become apparent upon reading the following detailed description and upon reference to the accompanying drawings in which.

Figure 1:
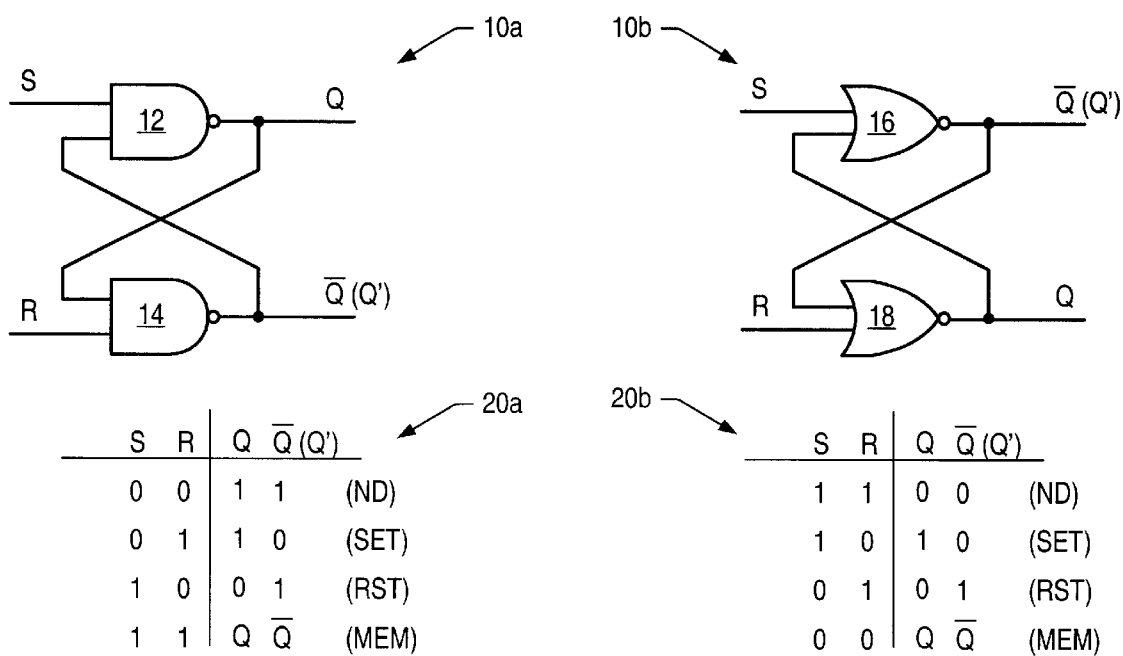
FIG. 1 is a circuit schematic of NAND gate and NOR gate latches, with corresponding truth tables noting a non-desired output condition of the respective latches.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
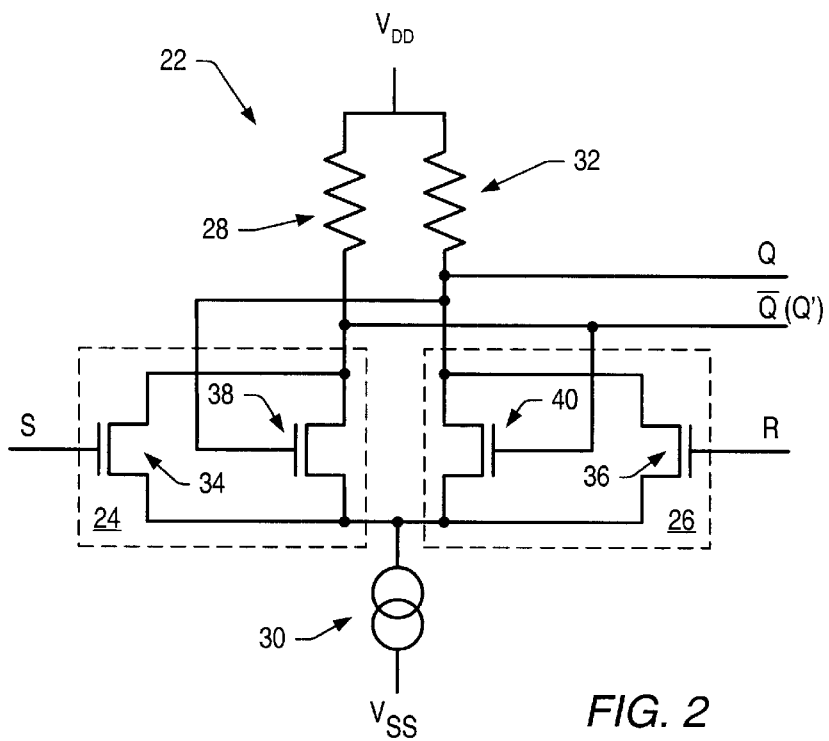
FIG. 2 is an exemplary circuit schematic of a NOR gate latch configured using MOSFET or bipolar transistors that prevent a non-desired output condition if the set and reset conductors receive logic one voltage values.

Turning now to the drawings, FIG. 2 illustrates the various circuit components which constitute a NOR gate SR latch 22. Latch 22 includes a pair of cross-coupled NOR gates 24 and 26, shown in dashed lines. NOR gate 24 can include two transistors connected in parallel between a resistor 28 and a current source 30. Similarly, NOR gate 26 includes a pair of transistors coupled between resistor 32 and current source 30. Resistors 28 and 32 serve mostly as pull-up resistors if current does not flow through them or as pull-down resistors if current does flow.

Current source 30 can be envisioned in numerous ways. For example, current source can simply be a resistor or a transistor with the emitter/source connected to ground ($V_{SS}$), with the gate/base connected so that the source/drain or collector/emitter produces current sunk into $V_{SS}$. Alternatively, the current source can be two transistors connected in series, a transistor and a resistor connected in series, etc., the function of which is merely to provide a current path to $V_{SS}$. If, for example, the set and reset inputs each receive a logic 1 level and the transistors 34 and 36 are NMOS or NPN transistors, then a current path will be established through transistors 34 and 36 to cause each of the Q and Q' outputs to be at a logic 0 level. In this manner, a non-desired output state is produced when the complimentary outputs of a differential latch are at the same logic level. As stated above, this non-desired state is to be avoided. Therefore, latch 22 of FIG. 2 is shown to provide an example of one way in which to form a latch. In the example provided, a NOR gate SR latch that does not avoid a non-desired state is shown.

The transistors of the latch can be MOSFET or bipolar transistors, in which case the current source may or may not be needed. However, if used, the current source provides Common Mode Logic (CML). By providing a relatively constant current to the source or emitter of corresponding transistors within NOR gates 24 and 26, the transistors within the NOR gates can be prevented from fully conducting and going into a saturation mode. Thus, there may be some resistance involved with current source 30 that places the source/emitter voltage near the gate voltages of the transistors. Hence, the CML mode of operation allows very fast switching time by eliminating the saturation-mode of operation. In some circles of nomenclature, current source 30 can be considered within a bipolar arrangement as coupled to emitters of the corresponding transistors. The common emitter resistor associated with current source 30, and applied to the differential amplifier of transistors 38 and 40, causes the overall configuration to be referred to as emitter-coupled logic (ECL).

Figure 3:
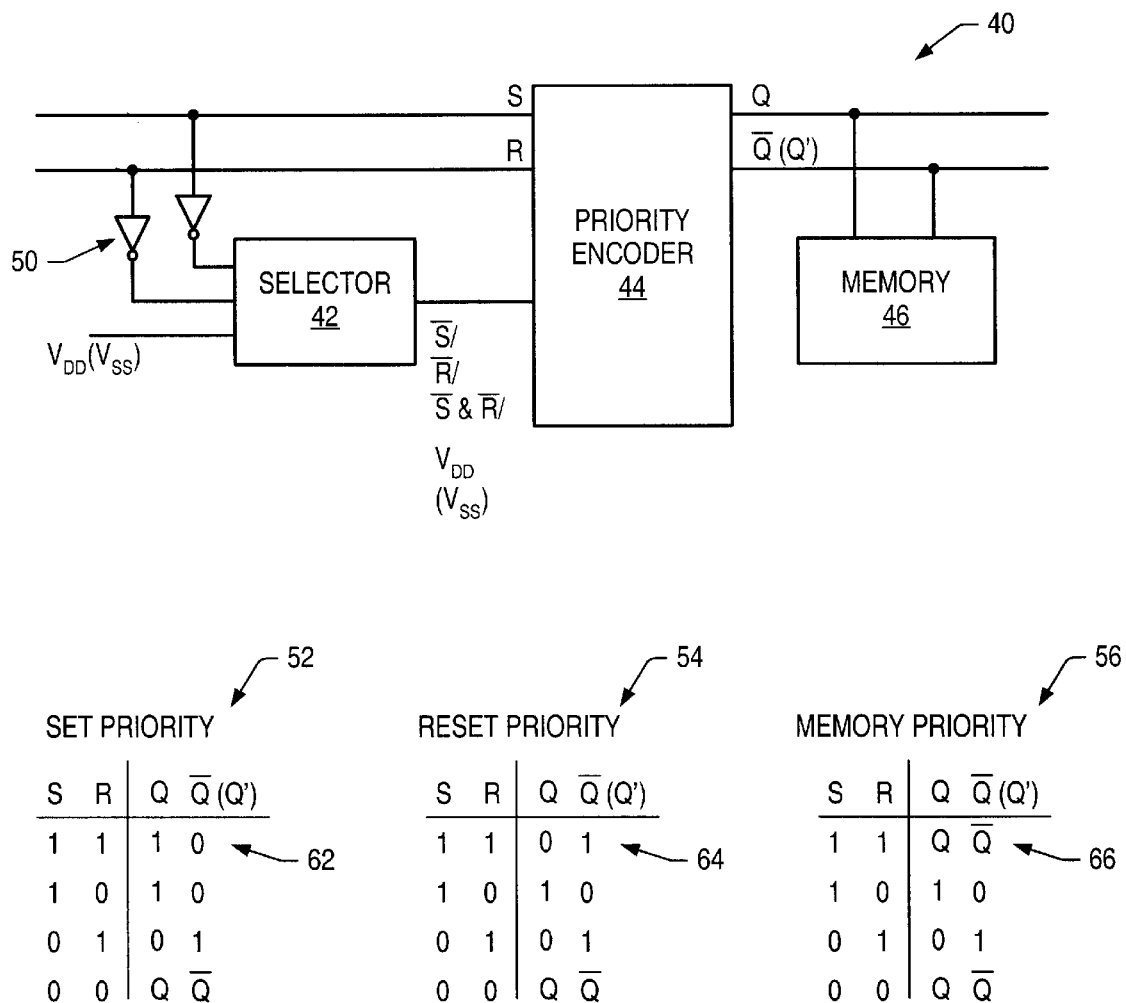
FIG. 3 is a block diagram of a SR latch that selects whether the set input, the reset input, or both the set and reset inputs will prioritize how the output conductors will respond to both the set and reset conductors having the same logic voltage value, according to one example.

Regardless of whether CML, ECL, or whether MOSFET or bipolar transistors are used, the intent of the invention is to prevent a non-desired output state. This applies equally to whether or not the SR latch is configured using quasi-NOR gates or quasi-NAND gates with cross-coupled outputs. FIG. 3 illustrates an improved circuit that can be employed as a latch and, preferably, the improved circuit is SR latch 40. Latch 40 includes selector 42, prioritizer 44, and memory 46. The selector is coupled to receive logic levels complimentary to the inputs sent to prioritizer 44. For example, priority encoder 44 may receive set and reset signals, such that selector 42 may receive set' and reset' voltage values. In this manner, whatever logic level is sent to the input of prioritizer 44 is subsequently inverted by inverters 50 and placed into the input of selector 42. Additionally, the positive and negative power supply ($V_{DD}$ or $V_{SS}$) voltages are also input to selector 42.

Selector 42 thereby selects at least one, and preferably two, of the signals sent to selector 42 depending on how prioritizer 44 is to be configured to operate. Prioritizer 44 thereby chooses which input signal, set, reset, or both set and reset, should be given priority in determining how to set the differential output voltages Q and Q'. For example, selector 42 can select S' (i.e. set') as an input to prioritizer 44. Upon receiving the set' input, prioritizer 44 will operate as a set-dominant circuit. If R' is selected, then prioritizer 44 will operate as a reset-dominant circuit. Alternatively, if both S' and R' are selected, then prioritizer 44 will operate as a memory-dominant circuit. Depending on whether prioritizer 44 uses PMOS or NMOS transistors, either $V_{DD}$ or $V_{SS}$ will be placed into prioritizer 44.

If prioritizer 44 operates as a set-dominant circuit, then the set input will take priority, and a truth table will result from prioritizer 44, as shown by reference numeral 52. Truth table 52 indicates that when both set and reset inputs have a logic 1 level, then the Q output will take the same value as the set input, while the Q' output is forced to an opposite logic level to that of Q. Thus, the set input will dominate and cause the Q value of the normally non-desired output state to be forced to the set input value (i.e., the set-dominant circuit forces the non-desired output state to be "set").

Similarly, a reset-dominant circuit causes priority to be given to the reset input, as shown in truth table 54. In this manner, when both of the set and reset inputs are at logic 1 levels, the reset input will cause the Q' output to be at a logic 1 level and the Q output to be at an opposite logic level thereby denoting a "reset" condition. Truth table 56 indicates the operation of a memory dominant circuit operation. As shown in truth table 56, when both S' and R' are selected by selector 42, prioritizer 44 will cause the non-desired state to be forced into the same condition as if latch 40 were in a memory state (i.e., the output values Q and Q' maintain the same logic state as the state they were in prior to entering the non-desired state, in which set and reset are at logic 1 values).

Thus, the non-desired states 62, 64, and 66 of the set-dominant, reset-dominant, and memory-dominant circuits are, therefore, shown in FIG. 3 to take on the set state, the reset state, and the memory state of an SR latch. These states are forced upon the latch outputs instead of the normal output conditions, in which the complimentary outputs in conventional latch designs have identical logic levels.

Figure 4:
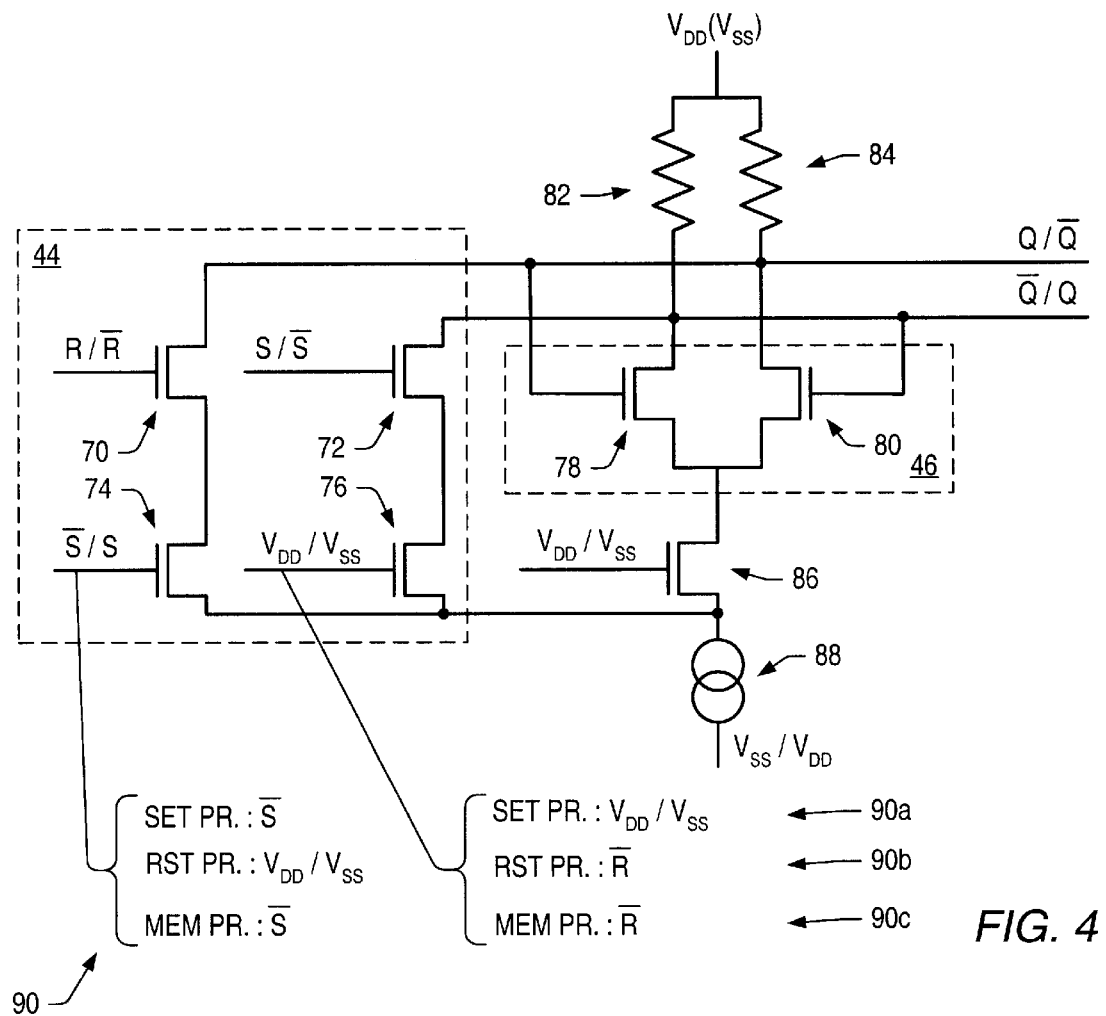
FIG. 4 is a circuit schematic of the various blocks of FIG. 3, according to one embodiment, depictive of numerous corresponding transistors being either NMOS, PMOS, NPN or PNP transistors coupled to form either a set-dominant, a reset-dominant or memory-dominant SR latch.

FIG. 4 illustrates an example by which prioritizer 44 and memory 46 can be implemented to avoid a non-desired latch output state. If the transistors are of the same type, either NMOS or PMOS (or either NPN or PNP), then prioritizer 44 includes two pairs of series-connected transistors. The upper transistors 70 and 72 receive the set and reset inputs of the latch, while the lower transistors 74 and 76 receive programmed input voltages. Such programmed input voltages will be discussed in further detail below in reference to FIGS. 6–8. The series-connected pairs of transistors produce output voltages upon the output conductors of prioritizer 44, and those voltages are latched upon Q and Q' in their present state by memory 46. Memory 46 can include a pair of cross-coupled transistors 78 and 80. In this manner, pull-up resistors 82 and 84 in combination with transistors 78 and 80 serve as a differential amplifier, where current flowing through one resistor, but not the other resistor, will cause the latch outputs to be complimentary to one another. The differential amplifier function can further be carried out, for example, by transistor 86 and current source 88. Current source 88 is configured similar to current source 30 in FIG. 2, where transistor 86 forwards current to the current source during operation of the differential amplifier.

As such, FIG. 4 is illustrative of a set-dominant circuit. If both the set and reset inputs are at a logic 1 level, current will flow only through transistor pairs 72 and 76. However, since S' is at a logic 0 level, no current will flow through transistor pairs 70 and 74. This results in current forwarded through resistor 82, but not through resistor 84, and thus, causes Q' to be pulled down to a logic 0 level by virtue of current through transistor 78 and 86. At the same time, the value of Q will remain at a logic 1 level by virtue of no current through resistor 84 and transistor 80. By adding transistor 74 with a gate input complimentary to the set input, transistor 74 essentially gates off reset transistor 70, such that reset transistor 70 has no effect on the SR latch output. Transistors 76 and 86 are also added to the latch circuit with their gates tied to $V_{DD}$ so that these transistors are always on. In this manner, transistors 76 and 86 are included to match the structure and biasing of transistor 74.

In an alternative example, a reset-dominant circuit is constructed similar to the set-dominant circuit. However, instead of placing S' and $V_{DD}$ on the inputs of transistors 74 and 76, respectfully, a reset-dominant circuit places $V_{DD}$ and R' at those inputs. Furthermore, a memory-dominant circuit has the same circuit structure as the set and reset dominant circuits. However, a memory-dominant circuit places S' at the input of transistor 74 and R' at the input of transistor 76. Thus, in a memory-dominant circuit, when the set and reset signals are at the same logic level (either a logic 0 or logic 1 value), the set and reset functions are disabled and the SR latch stays in the previous state (i.e. the state it was in before receiving set and reset signals of the same logic value). Item 90, therefore, indicates the signals selectively placed on the gate/base of transistor 74 and 76 during a set-dominant configuration 90a, a reset-dominant configuration 90b, and a memory-dominant configuration 90c.

Alternative configurations of the SR latch are illustrated in FIG. 4 with reference to the right hand side of the backslash ("/"). For example, instead of using NMOS and NPN transistors, PMOS and PNP transistors can be used. If, for example, PMOS or PNP transistors are used, $V_{SS}$ can be substituted wherever $V_{DD}$ is used. Moreover, a complimentary input signal is substituted wherever reset, set, reset', or set' signals are used. In this fashion, a set-dominant, a reset-dominant, or a memory-dominant circuit can be formed using exclusively NMOS or NPN transistors, or using exclusively PMOS or PNP transistors. In addition, FIG. 4 illustrates a NOR gate SR latch. It is recognized, however, that a NAND gate SR latch can also be used by simply rearranging the transistors from a parallel/serial configuration to a serial/parallel configuration with various other modifications that would be known to those skilled in the art having the benefit of this disclosure. Accordingly, the present circuit can be employed either as a NAND gate configuration or a NOR gate configuration, and with NMOS, PMOS, NPN, or PNP transistors, all of which would be readily known after having the benefit of this disclosure.

It is noted that the transistor arrangement of FIG. 4, while shown generically as transistors, the transistors can be either NMOS transistors or PMOS transistors. For sake of brevity in the drawing of FIG. 4, while the transistors appear as NMOS transistors, it is understood that the circuit shown can be NMOS or PMOS transistors. In addition to the aforementioned arrangements, prioritizer 44 can also be configured in a CMOS arrangement by using a combination of PMOS transistors and NMOS transistors. For example, a CMOS set-dominant circuit, CMOS reset-dominant circuit, and a CMOS memory-dominant circuit can be employed if desired.

It is recognized that a latching circuit (or memory circuit 46) can be coupled to retain the MOS (NMOS, PMOS or CMOS) set, reset and memory dominant outcomes. Moreover, the Q' output, complementary to Q output, can be readily derived by an inverter coupled to the output conductor.

Figure 5:
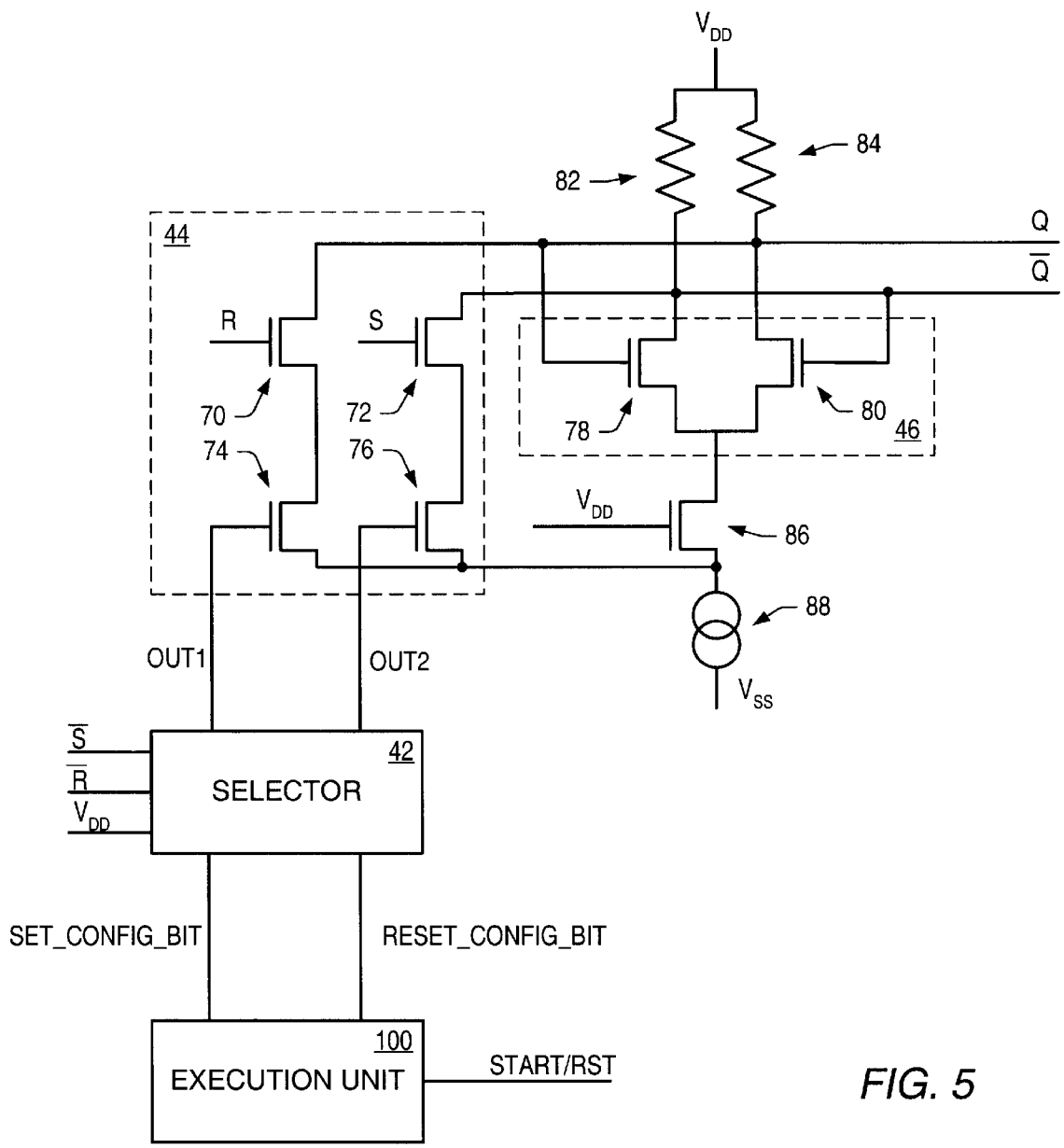
FIG. 5 is combination block diagram and circuit schematic of the selector block of FIG. 3 coupled to certain transistors of the prioritizer of FIG. 4, where the selector block is capable of being programmed with configuration bits to produce output signals that configure the prioritizer block to form a set-dominant, a reset-dominant, or memory-dominant SR latch.

FIG. 5 illustrates an example by which prioritizer 44 and memory 46 can be programmably configured to operate as a set-dominant, a reset-dominant, or a memory-dominant latch. In particular, FIG. 5 shows selector circuit 42 adapted to receive programmable configuration bits which programmably configures the operation of prioritizer 44 to form a set-dominant, a reset-dominant, or memory-dominant SR latch. For sake of simplicity, the SR latch of FIG. 5 will be described herein using reference numerals identical to those used to describe the SR latch of FIG. 4.

The SR latch circuit of FIG. 5 illustrates prioritizer 44 coupled to receive a pair of set and reset signals, and selector circuit 42 coupled to receive a complimentary pair of set and reset signals (denoted as "S bar" or S' and "R bar" or R') and a power supply voltage, $V_{DD}$). In addition, selector circuit 42 is shown having a pair of input conductors, upon which programmable configuration bits, SET_CONFIG_BIT and RESET_CONFIG_BIT, are sent from execution unit 100. Execution unit 100 is a state machine, in one example, which sets each of the configuration bits to either a logic 1 value or a logic 0 value depending on whether the latch is to be configured as a set-dominant, a reset-dominant, or memory-dominant latch.

The state machine is programmable—either in hardware, firmware or software. A programmed state machine produces a desired voltage output upon the SET_CONFIG_BIT and the RESET_CONFIG_BIT depending upon how the state machine is programmed. A start or reset signal (START/RST) initiates the state machine to begin code execution and initiate values upon the SET_CONFIG_BIT and RESET_CONFIG_BIT. Selector circuit 42 also includes a pair of output conductors upon which programmable input signals, OUT1 and OUT2, are coupled to transistors 74 and 76 of prioritizer 44, respectively. In this manner, selector circuit 42 is adapted to programmably configure prioritizer 44 to produce a complementary pair of logic values dependent on a logic value of the programmable configuration bits.

Figures 6, 7:
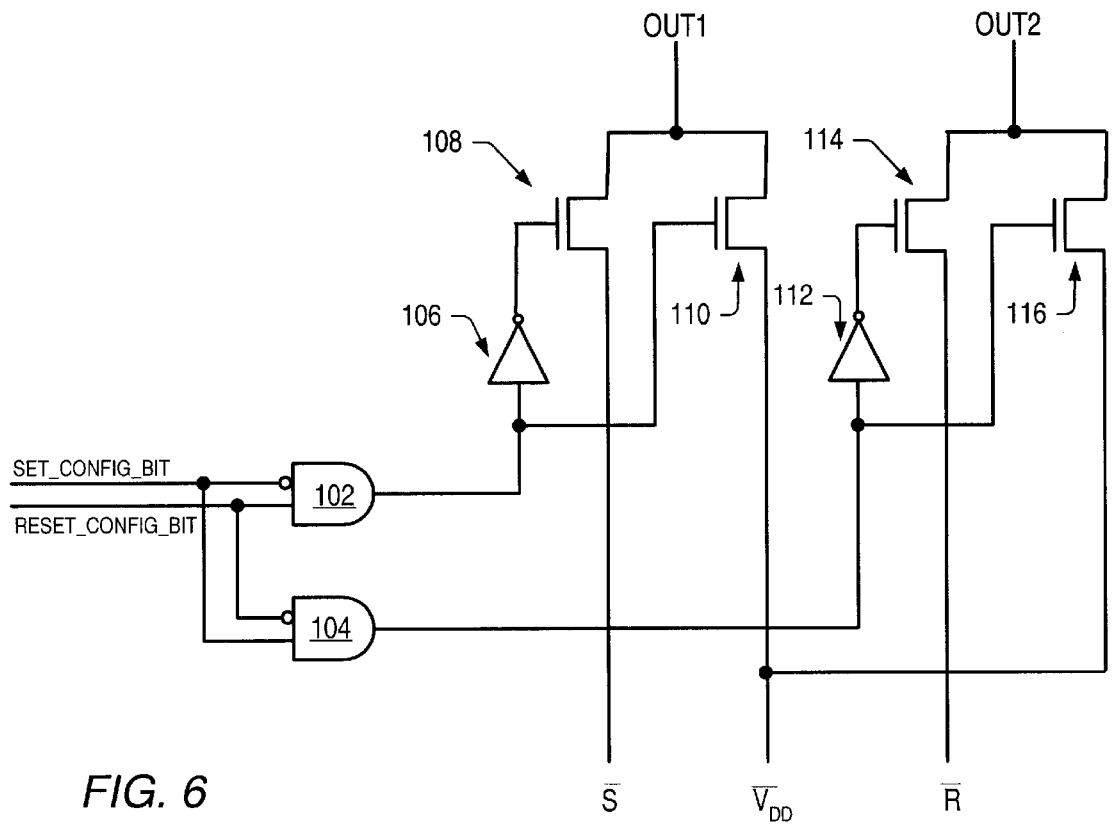
FIG. 6 is a circuit schematic of the selector block of FIG. 5, which is capable of being programmed to produce a pair of outputs fed to a pair of gate conductors of the prioritizer transistors.
FIG. 7 is a truth table depicting the operation of the selector block of FIG. 5, and the resulting configuration imputed to the prioritizer.

The operation of selector 42 is best explained in reference to FIGS. 7 and 8, which illustrate an exemplary circuit diagram of selector 42 and corresponding truth table, respectively. As shown in FIG. 6, selector circuit 42 includes a pair of logic gates 102 and 104 coupled to receive the programmable configuration bits from execution unit 100. In the example shown in FIG. 6, the pair of logic gates is implemented as a pair of AND logic gates, each having one inverting input. In this manner, logic gate 102 produces a RESET_CONFIG_BIT & !(SET_CONFIG_BIT) output, while logic gate 104 produces a !(RESET_CONFIG_BIT) & SET_CONFIG_BIT output (where ! represents the inverted input of the gate).

Selector circuit 42 also includes two pairs of transistors, such that each pair of transistors is coupled to receive an output and a complementary output from the pair of logic gates 102 and 104. In this fashion, a first pair of the transistors 108 and 110 is coupled to receive the output of logic gate 102, such that transistor 110 is directly coupled to receive the output of logic gate 102 and transistor 108 is indirectly coupled to receive the complementary output of logic gate 102 by way of inverter 106. Likewise, a second pair of the transistors 114 and 116 is coupled to receive the output of logic gate 104, such that transistor 116 is directly coupled to receive the output of logic gate 104 and transistor 114 is indirectly coupled to receive the complementary output of logic gate 104 by way of inverter 112.

In addition to the programmable configuration bits, selector circuit 42 can also receive S', R', and $V_{DD}$ input signals and to produce a pair of voltage values upon the output conductors, OUT1 and OUT2, of selector 42. As such, the first pair of transistors 108 and 110 is coupled to output conductor OUT1, while the second pair of transistors 114 and 116 is coupled to output conductor OUT2. In this manner, the first pair of transistors 108 and 110 will couple either a power supply voltage ($V_{DD}$) or a voltage value complementary to the set signal (S') upon output conductor OUT1, depending on the logic values of the programmable configuration bits. Similarly, the second pair of transistors 114 and 116 will couple either a power supply voltage ($V_{DD}$) or a voltage value complementary to the reset signal (R') upon output conductor OUT2, depending on the logic values of the programmable configuration bits. Thus, the programmable configuration bits force selector circuit 42 to select one of three configuration states, as described above.

FIG. 7 is a truth table outlining the logic values of the programmable configuration bits required to select one of the three configuration states including: a memory configuration state, a reset configuration state, or a set configuration state. For example, selector circuit 42 will produce a pair of voltage values complementary to the pair of set and reset signals sent to prioritizer 44 during times when the programmable configuration bits have substantially similar logic values. In other words, when both SET_CONFIG_BIT and RESET_CONFIG_BIT are at the same logic value (i.e. either at logic 0 or logic 1 values), the first pair of transistors 108 and 110 will output the S' input signal to OUT1 while the second pair of transistors 114 and 116 outputs the R' input signal to OUT2. In such a case, selector circuit 42 is adapted to configure prioritizer 44 into a memory configuration state, such that the Q and Q' latch outputs retain their previous logic values.

In an alternative example, selector circuit 42 will produce a pair of voltage values complementary to the pair of set and reset signals sent to prioritizer 44 during times when the programmable configuration bits have substantially dissimilar logic values. In other words, prioritizer 44 can be configured into a set configuration state or a reset configuration state when the programmable configuration bits have complementary logic values. For instance, to configure prioritizer 44 into a reset configuration state, execution unit 100 will set the SET_CONFIG_BIT to a logic 0 value and the RESET_CONFIG_BIT to a logic 1 value. As such, the first pair of transistors 108 and 110 will selectively output the $V_{DD}$ signal on output conductor OUT1 and the R' input signal on output conductor OUT2. Such a configuration causes the Q latch output to be pulled down to a logic 0 value while the Q' latch output remains at a logic 1 value. Alternatively, execution unit 100 will set the SET_CONFIG_BIT to a logic 1 value and the RESET_CONFIG_BIT to a logic 0 value to configure prioritizer 44 into a set configuration state. In this manner, the second pair of transistors 114 and 116 will selectively output the S' input signal on output conductor OUT1 and the $V_{DD}$ signal on output conductor OUT2. Thus, the set configuration state causes the Q latch output to remain at a logic 1 value while the Q' latch output is pulled down to a logic 0 value.

Therefore, the present selector circuit can avoid a non-desired latch output state (i.e. when both latch outputs have similar logic values) by forcing the latch to produce complementary output signals regardless of the logic values of its inputs. In addition, the improved selector circuit is easily programmed to configure the latch into a memory-dominant state, a reset-dominant state, or a set-dominant state. However, even though selector circuit 42 is illustrated in FIG. 6 as including AND gates 102 and 104 and NMOS transistors 108, 110, 114, and 116, a skilled artisan having the benefit of this disclosure would recognize that selector circuit 42 could also be constructed using alternative logic gates and transistor types.

It will be appreciated to those skilled in the art having the benefit of this disclosure that the embodiments described herein are useful in forming a latch that need not be clocked, and that employs set and reset inputs. The embodiments prove useful in preventing a non-desired state, in which outputs that are designed to be complimentary nonetheless have the same logic level. The present latch is envisioned having either MOSFET or bipolar transistors, and can be employed having only NMOS transistors, only PMOS transistors, or both NMOS and PMOS transistors in a CMOS configuration. Likewise, the latch can use only NPN transistors, PNP transistors, or both. The gate inputs of certain transistors within the latch can be programmed by a selector circuit to place the latch in either a set-dominant, a reset-dominant, or a memory-dominant configuration based solely on the voltage values fed to the latch by the selector. In addition, the selector circuit is easily programmed by configuration bits to selectively configure the latch into one of the above configuration states. Such a selector circuit embodies an improved programmability over previous circuits. Moreover, the various set, reset and memory dominant circuits may be constructed to have minimum gate delays (i.e., propagation delay). It is intended that the following claims be interpreted to embrace all such modifications and changes envisioned by such claims. Accordingly, the specification and drawings are to be regarded in an illustrative rather than restrictive sense.

What is claimed is:

1. A latch circuit, comprising:
   a selector having a pair of input conductors, a first selector output conductor, and a second selector output conductor;
   a prioritizer coupled to receive a set signal, a reset signal, and a pair of selector signals upon the first and second output conductors, wherein the prioritizer produces a pair of output signals of complementary logic values dependent on a logic value of programmable signals forwarded to the pair of input conductors.

2. The latch as recited in claim 1, wherein the first and second selector output conductors are adapted to produce a pair of selector signals complementary in logic value to the set and reset signals during times when the programmable signals are of substantially similar logic value.

3. The latch as recited in claim 1, wherein the first selector output conductor is adapted to produce a selector signal complementary in logic value to the set signal during times when the programmable signals are of substantially dissimilar logic value.

4. The latch as recited in claim 1, wherein the second selector output conductor is adapted to produce a selector signal complementary in logic value to the reset signal during times when the programmable signals are of substantially dissimilar logic value.

5. The latch as recited in claim 1, wherein the selector comprises:
   a pair of logic gates coupled to receive the pair of input conductors; and
   two pairs of transistors, wherein each pair of transistors is coupled to receive an output and a complementary output from the pair of logic gates.

6. The latch as recited in claim 5, wherein a first pair of the transistors is coupled to the first selector output conductor, and wherein a second pair of the transistors is coupled to the second selector output conductor.

7. The latch as recited in claim 6, wherein the first pair of transistors is adapted to couple either a power supply voltage or a voltage value complementary to the set signal upon the first selector output conductor dependent on the logic value of the programmable signals.

8. The latch as recited in claim 6, wherein the second pair of transistors is adapted to couple either a power supply voltage or a voltage value complementary to the reset signal upon the second selector output conductor dependent on the logic value of the programmable signals.

9. A system for latching complementary voltage values, comprising:
   a prioritizer coupled to receive a set signal, a reset signal and a pair of selector signal; and
   a selector coupled to receive programmable inputs and to produce the pair of selector signals to forward to the prioritizer, wherein the prioritizer is configured to latch the complementary logic voltage values at the output of the prioritizer depending on a logic value of the pair of selector signals, and regardless of whether the set and reset signals are at the same or dissimilar logic voltage values.

10. The system as recited in claim 9, wherein the selector comprises a first selector output conductor coupled to produce a power supply voltage or a logic voltage value complementary to the set signal, depending on the voltage value of the programmable inputs.

11. The system as recited in claim 10, wherein the selector comprises:
   a first logic gate coupled to receive the programmable inputs; and
   a first pair of transistors coupled to place either the power supply voltage or the logic voltage value complementary to the set signal upon the output conductor.

12. The system as recited in claim 9, wherein the selector comprises a second output conductor coupled to produce either a power supply voltage or a logic voltage value complementary to the reset signal, depending on the voltage value of the programmable inputs.

13. The system as recited in claim 12, wherein the selector comprises:
   a second logic gate coupled to receive the programmable inputs; and
   a second pair of transistors coupled to place either the power supply voltage or the logic voltage value complementary to the reset signal upon the out put conductor.

14. The system as recited in claim 9, further comprising an execution unit coupled to program the programmable inputs in one or two logic voltage values.

15. The system as recited in claim 9, wherein the logic voltage value of the programmable inputs deternines whether the set signal or the reset signal is latched upon an output of the prioritizer.

16. A method for preventing a non-desired latch output, comprising:
   receiving a similar voltage value on set and reset conductors;
   receiving the voltage values;
   depending on the programmable voltage values, placing upon a pair of output conductors of the latch either (i) the logic voltage value on the set conductor and its complimentary logic voltage value, (ii) the logic voltage value on the reset conductor and its complimentary logic voltage value, or (iii) the logic voltage values on the output conductors preceding the step of receiving a similar logic value on set and reset conductors; and
   further comprising programming the voltage values to fix the output of the latch set-dominant latch output if the output conductors have the voltage value on the set conductor and its complementary logic voltage value.

17. A method for preventing a non-desired latch output, comprising:
   receiving a similar logic voltage value on set and reset conductors;
   receiving programmable voltage values;
   depending on the programmable voltage values, placing upon a pair of output conductors of the latch either (i) the logic value on the set conductor and its complementary logic voltage value, (ii) the logic voltage value on the reset conductor and its complimentary logic voltage value, or (iii) the logic voltage values on the output conductors preceding the step of receiving a similar logic voltage value on set and reset conduct; and
   further comprising programming the voltage values to fix the output of the latch as a reset-dominant latch output if the output conductors have the voltage value on the reset conductor and its complementary logic voltage value.

18. A method for preventing a non-desired latch output, comprising:
   receiving a similar logic value on set and reset conductors;
   receiving programmable voltage values;
   depending on the programmable voltage values, voltage values, placing upon a pair of output conductors of the latch either (i) the logic voltage value on the set conductor and its complementary logic voltage value, (ii) the logic voltage value on the reset conductor and is complementary logic voltage value, or (iii) the logic voltage values on the output conductors preceding the step of receiving a similar logic voltage value on set and reset conductors; and further comprising programming the voltage values to fix the output of the latch as a memory-dominant latch output if the output conductors have logic voltage values the same as those preceding the step of receiving.

* * * * *

UNITED STATES PATENT AND TRADEMARK OFFICE
CERTIFICATE OF CORRECTION

PATENT NO. : 6,657,472 B1 Page 1 of 1
DATED : December 2, 2003
INVENTOR(S) : Raza It is certified that error appears in the above-identified patent and that said Letters Patent is hereby corrected as shown below:

Column 11,
Line 44, please delete "pair of selector signal" and substitute therefor -- pair of selector signals --.

Column 12,
Line 10, please delete "upon the out put" and substitute therefor -- upon the output --.
Line 16, please delete "deternines" and substitute therefor -- determines --.
Line 21, please delete "similar voltage value" and substitute therefor -- similar logic voltage value --.
Line 23, please delete "the voltage values" and substitute therefor -- programmable voltage values --.
Lines 27, 28 and 46, please delete "complimentary" and substitute therefor -- complementary --.
Lines 32 and 44, please delete "logic value" and substitute therefor -- logic voltage value --.
Line 34, please delete "the latch set-dominant" and substitute therefor -- the latch as a set-dominant --.
Line 49, please delete "reset conduct" and substitute therefor -- reset conductors --.
Line 58, please delete "similar logic value" and substitute therefor -- similar logic voltage value --.
Lines 62-63, please delete "voltage values, voltage values" and substitute therefor -- voltage values, --.
Line 67, please delete "is complementary" and substitute therefor -- its complementary --.

Signed and Sealed this

Sixth Day of April, 2004

JON W. DUDAS
*Acting Director of the United States Patent and Trademark Office*